United States Patent [19]

Jang

[11] Patent Number: 5,545,910
[45] Date of Patent: Aug. 13, 1996

[54] ESD PROCTECTION DEVICE

[75] Inventor: Wen-Yueh Jang, Hsin Chu, Taiwan

[73] Assignee: Winbond Electronics Corp., Hsinchu, Taiwan

[21] Appl. No.: 227,355

[22] Filed: Apr. 13, 1994

[51] Int. Cl.⁶ .................................................. H01L 23/62
[52] U.S. Cl. ........................ 257/362; 257/359; 257/363
[58] Field of Search ................................... 257/358, 359, 257/362, 363

[56] References Cited

U.S. PATENT DOCUMENTS

| 4,503,448 | 3/1985 | Miyasaka | 257/363 |
| 5,218,222 | 6/1993 | Roberts | 257/363 |

FOREIGN PATENT DOCUMENTS

| 56-50527 | 5/1981 | Japan | 257/362 |
| 56-79463 | 6/1981 | Japan | 257/362 |
| 58-161375 | 9/1983 | Japan | 257/362 |
| 2090701 | 7/1982 | United Kingdom | 257/362 |

*Primary Examiner*— Ngân V. Ngô
*Attorney, Agent, or Firm*—Meltzer, Lippe, Goldstein et al.

[57] ABSTRACT

An ESD protection device is disclosed having a first region of a first conductivity type. A second region, which is heavily doped, of a second conductivity type is disposed in the first region. The second region extends from the surface of the first region a first depth. A third region, which is heavily doped, of the second conductivity type, is also disposed in the first region such that the third region is separated from the second region by a portion of the surface of the first region. The third region extends from the surface of the first region a second depth less than the first depth of the second region. An insulating region is grown on a portion of the surface of the first region between the second and third regions. Furthermore, a resistive conducting region is disposed on the second region and the insulating region. A portion of the resistive conducting region extends beyond the second region for receiving an input signal.

8 Claims, 3 Drawing Sheets

ESD PROCTECTION DEVICE

FIELD OF THE INVENTION

The present invention relates to an ESD protective device for MOSFET integrated circuits. The inventive device has a breakdown voltage between 8 and 9 volts, making it compatible with very small scale MOSFET elements, having gate oxides as thin as 90 Angstroms.

BACKGROUND OF THE INVENTION

It is well known that MOSFET circuits are susceptible to electrostatic discharge (ESD), and are generally buffered from ESD signals by some type of ESD protection circuit. A typical ESD protection circuit is shown in FIG. 1. The ESD protection circuit extends between an input pad 10 and an input buffer 50. The ESD protection circuit includes current limiting element 30 and voltage limiting elements 20 and 40. These elements 20, 30 and 40 prevent any incoming signal from exceeding the breakdown threshold of the internal MOSFETs.

As MOSFET fabrication technology reduces device dimensions to sub-micron levels, the gate oxide thickness of the MOSFET devices thereof may be as small as 90 to 110 Angstroms. A MOSFET of this scale can be damaged by an ESD signal of a mere 9 volts. Therefore, the voltage breakdown level required of an adequate ESD protection circuit is 9 volts or less.

Prior art ESD protection circuits have typically used a resistor as the current limiting element, and a reverse-biased diode as the voltage limiting element. Examples of these prior art voltage limiting elements are listed below, with their respective breakdown voltages:

| | |
|---|---|
| a) Reversed p-n Junction Diode | >13 volts |
| b) Gated MOSFET | >13 volts |
| c) Field Effect Transistor | >10 volts |
| d) SCR | >10 volts |

Since all of the listed prior art examples have breakdown voltages of greater than 10 volts, it is clear that they can not provide adequate protection for sub-micron MOSFETs.

Therefore, it is an object of the present invention to provide an ESD protection device with a voltage breakdown level of 9 volts or less. It is a further object of the present invention to utilize reliable and repeatable fabrication techniques in the manufacture of the inventive device.

SUMMARY OF THE INVENTION

These and other objects are achieved by the present invention. According to one embodiment, an ESD protection device is provided which has a first region of a first conductivity type, e.g., p-type. A second region, which is heavily doped, of a second conductivity type, e.g., $n^+$ is disposed in the first region. The second region extends from the surface of the first region a first depth. A third region, which is heavily doped, of the second conductivity type, is also disposed in the first region but at some distance from the second region. That is, the third region is separated from the second region by a portion of the surface of the first region. The third region extends from the surface of the first region a second depth less than the first depth of the second region. An insulating region is grown on a portion of the surface of the first region between the second and third regions. Furthermore, a resistive conducting region is disposed on the second region and the insulating region. A portion of the resistive conducting region extends beyond the second region for receiving an input signal.

The second region illustratively forms a collector of a bipolar junction transistor (BJT). The portion of the first region between the second and third regions illustratively forms a base of the BJT and the third region illustratively forms an emitter of the BJT. The resistive conductive region functions as a current limiting resistor, between the inventive circuit input and a common connection to the above described BJT collector and the inventive circuit output.

The above described BJT functions as a voltage limiter for all signals passing through the aforementioned current limiting resistor, to which it is connected. Thus, any signal present at the input to the disclosed circuit is both current limited and voltage limited before exiting at the circuit output. This output is typically connected to an input buffer circuit, while the above described BJT emitter is connected to circuit ground.

The deep collector architecture of the disclosed embodiment results in a low collector-to-emitter punch through voltage of between 8 and 9 volts. Thus, it is capable of providing ESD protection for MOSFET elements with gate oxides as thin as 90 Angstroms.

DETAILED DESCRIPTION OF THE INVENTION

Figure 1:
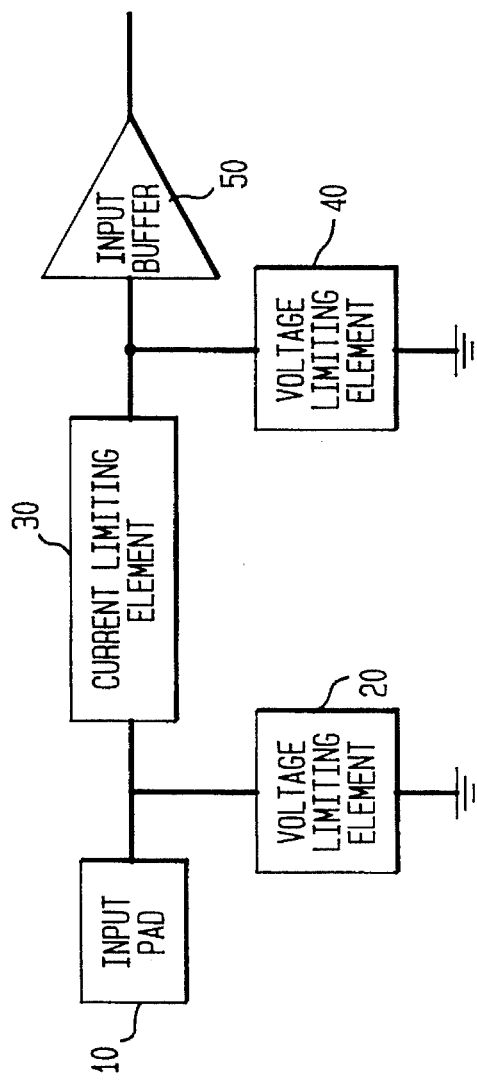
FIG. 1 is a block diagram representation of a conventional ESD protection circuit.

In the prior art diagram of FIG. 1, an ESD input signal received at input pad 10 would be filtered, in turn, by voltage limiting element 20, by current limiting element 30, and by voltage limiting element 40, before reaching input buffer 50. As described above, the breakdown voltage of elements 20 and 40 must be less than that of input buffer 50 and the internal MOSFET circuits to which it is connected, in order to adequately protect those circuits. In the illustrative embodiment of the present invention, voltage limiting element 20 of FIG. 1 is deleted, while input pad 10, input buffer 50, and circuit ground are all considered as external connections to the inventive device.

The formation of the ESD protection device according to the present invention is shown in FIG. 4. In a step A, a well 102, e.g., a p-well, is formed in a substrate 100, e.g., an n substrate, for example by ion implantation or diffusion. Then, as shown in step B, a field oxide layer (FOX) is grown to form insulating regions 108 and 110 using the well known LOCOS fabrication steps. As shown in step B, a thin gate oxide layer 104 is formed on the substrate 100 and well 102 surface. Then, a thin polycrystalline silicon layer 106 is formed on the thin gate oxide layer 104. A window is then etched between the insulating regions 108 and 110.

Then, as shown in step C, a polycrystalline silicon layer 112 is formed on the surface of the thin polycrystalline silicon layer 106, the insulating regions 108 and 110 and the exposed portion of the well 102. Using a thermal diffusion process, a POCl$_3$ or an n-type imputiy or dopant such as phosphorous deep diffuses from the polycrystalline silicon layer 112 into the well thereby forming the deep buried contact region 114. As shown in step D, the polycrystalline silicon layer 112, thin polycrystalline silicon layer 106 and thin gate oxide layer 104 are etched to expose a potion of the substrate 100 surface. Another heavily doped region 116 is then formed, for example, by implantation, at a distance from the region 114.

Figure 2:
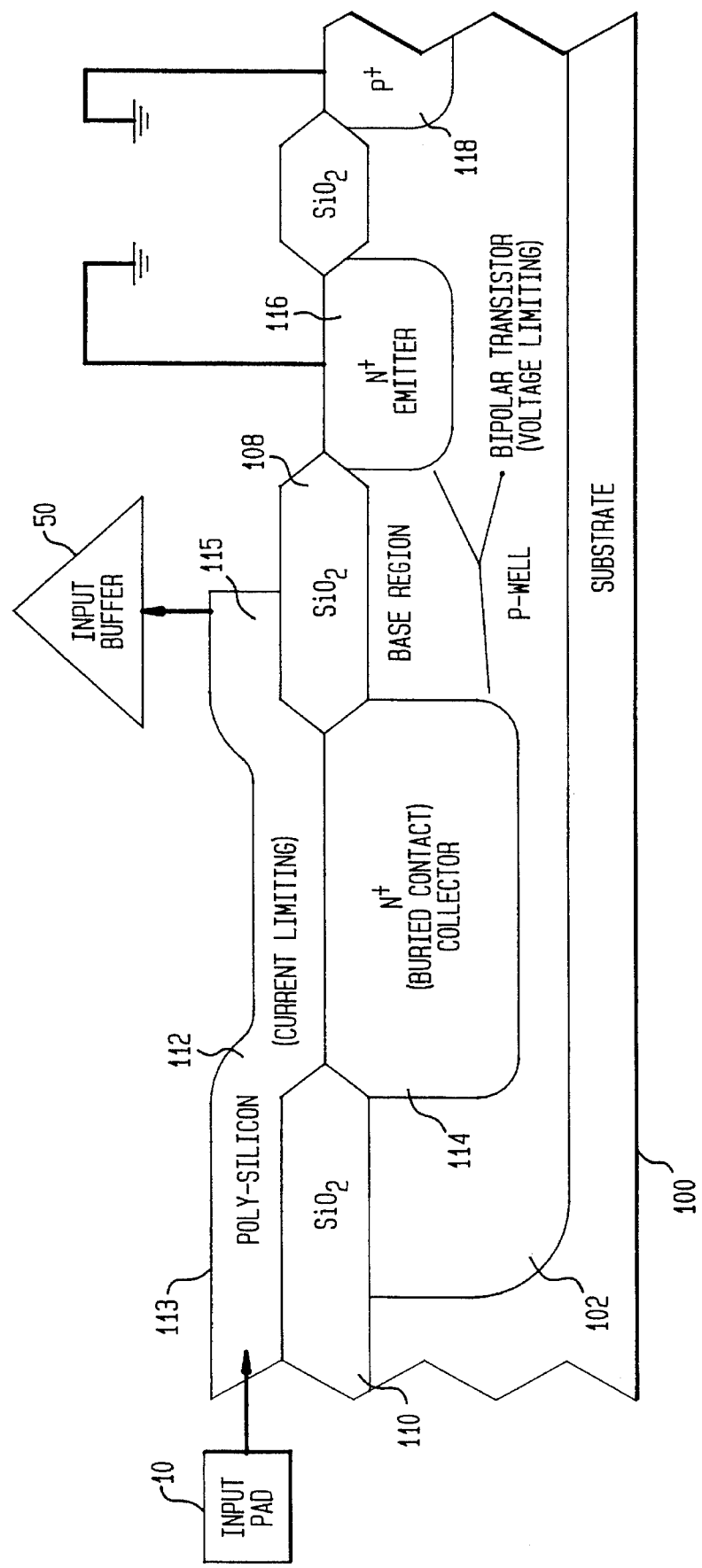
FIG. 2 depicts a cross-section view of the inventive device.
Figure 4A:
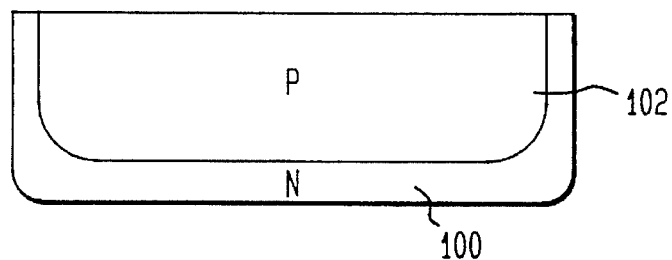
FIG. 4 illustrates the steps used in fabricating the inventive device.
Figure 4B:
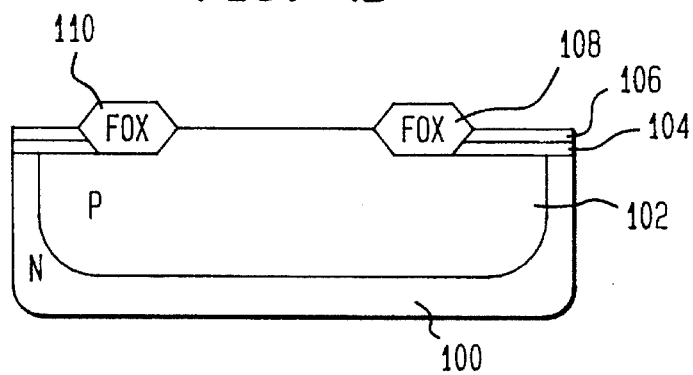
Figure 4C:
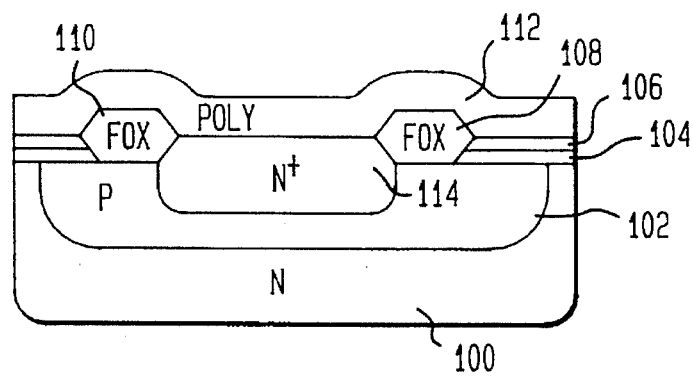
Figure 4D:
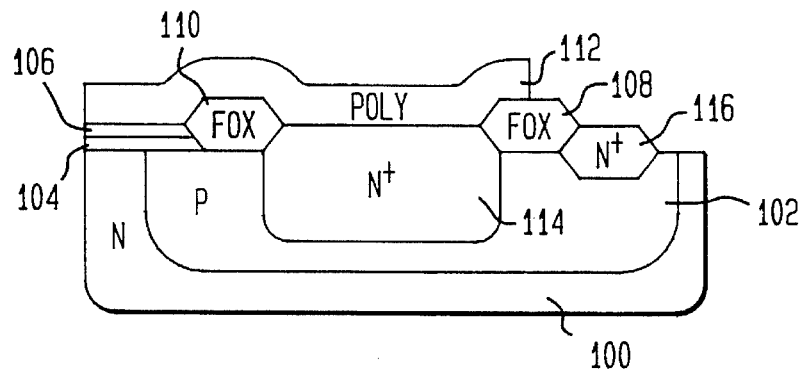

The present invention is depicted in FIG. 2, in cross-section view. Illustratively, the well 102 has a doping concentration of $8 \times 10^{16}$ and a depth of 1.8 μm. The doping concentration of the polycrystalline silicon region 112 is illustratively $10^{20}$. The doping concentration of the buried contact region 114 is illustratively $10^{18}$ and may have a depth of 0.6 μm. The doping concentration of the region 116 is illustratively $10^{20}$ and its depth may be 0.2 μm. Illustratively, the region 116 is separated from the buried contact region by a distance of 0.6 μm. A P$^+$ base contact region 118 may also be formed (in a fashion similar to forming the region 116) having similar doping concentrations and dimensions.

The configuration of the two n$^+$ regions 114 and 116 within the p-well 102 creates a bipolar transistor, with the buried contact n$^+$region 114 becoming a deep collector junction, the p-well area between the two n$^+$ regions becoming the base, and the less deep n$^+$ region 116 becoming the emitter. This bipolar transistor acts as the voltage limiting element in the inventive device.

On end 113 of the polycrystalline silicon region 112 on one side of the buried contact region 114 may be connected to an input pad 10. In such a case, the polycrystalline silicon region 112 becomes a current limiting resistor of the inventive device. The opposite end 115 of the polycrystalline silicon region 112 and the buried contact region 114 may be connected to an input buffer 50. Furthermore, the exposed surface area of the emitter region 116 is available for connection to ground.

Figure 3:
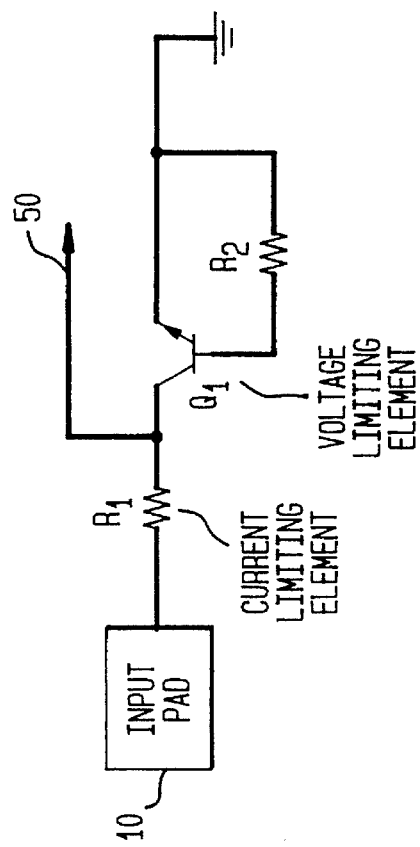
FIG. 3 schematically illustrates the equivalent circuit of the inventive device.

The equivalent circuit of the inventive device is shown in FIG. 3. The polycrystalline silicon element of FIG. 2 is represented by R$_1$ in FIG. 3, and the bipolar transistor of FIG. 2 is depicted as Q$_1$ in FIG. 3. Resistive element R$_2$ represents the p-well resistivity between base and ground in FIG. 2.

The buried contact, or deep collector junction, results in a low punch through voltage between collector and emitter of the inventive bipolar transistor. In the present embodiment, the punch through voltage range is between 8 and 9 volts, which is low enough to provide adequate protection to MOSFET gate oxides as thin as 90 Angstroms.

The phosphorus thermal diffusion process provides a reliable and highly reproducible method for fabrication of the inventive device. Other techniques may be used, however, to produce the same inventive architecture, and will still result in the desired low voltage punch through (breakdown) characteristic.

Finally, the above described embodiment of the invention is intended to be illustrative only. Numerous alternative embodiments may be devised by those skilled in the art without departing from the spirit and scope of the following claims.

I claim:

1. An integrated circuit which includes an ESD protection device, comprising a first region of a first conductivity type, an insulating region grown on a first portion of a surface of said first region, a resistive conducting region containing impurities disposed on said insulating region and on a second portion of said surface of said first region adjacent to said first portion of said surface, a second region, which is heavily doped, of a second conductivity type, formed under said resistive conducting region to a particular first depth from a surface of said first region by thermally diffusing impurities from said resistive conducting region through said second surface portion, and a third region, which is heavily doped, of said second conductivity type, disposed in said first region and extending to a second depth, less than said particular first depth, from a third surface portion of said first region, which third surface portion is adjacent to said first portion of said surface and opposite to said second portion of said surface, an input pad for receiving an external signal, said input pad being connected to one end of said resistive conducting region, and an output pad for connecting to external circuits, said output pad being connected to another end of said resistive conducting region which overlies said insulating region.

2. The integrated circuit of claim 1 wherein said resistive conducting region is a current limiting resistor between said input pad and said output pad.

3. The integrated circuit of claim 1 wherein said second region forms a collector of a bipolar transistor, a portion of said first region, between said second region and said third region, forms a base of said bipolar transistor, and said third region forms an emitter of said bipolar transistor, wherein said bipolar transistor is a voltage limiter for signals impinging on said input pad.

4. The integrated circuit of claim 1 wherein said first conductivity type is p.

5. The integrated circuit of claim 1 wherein said first conductivity type is n.

6. The integrated circuit of claim 1 wherein said insulating region is silicon dioxide.

7. The integrated circuit of claim 1 wherein said resistive conducting region is polycrystalline silicon.

8. The integrated circuit of claim 3 wherein said bipolar transistor breakdown voltage is less than 9 volts.

* * * * *